United States Patent

Sato

[11] Patent Number: 6,125,462
[45] Date of Patent: Sep. 26, 2000

[54] TESTING MECHANISM IN A SEMICONDUCTOR INTEGRATED CIRCUIT DEVICE USING AN EXTERNAL CLOCK SIGNAL AND A NON-CONNECTION PIN INPUT SIGNAL

[75] Inventor: Fumihiko Sato, Tokyo, Japan

[73] Assignee: NEC Corporation, Tokyo, Japan

[21] Appl. No.: 09/030,909

[22] Filed: Feb. 26, 1998

[30] Foreign Application Priority Data

Feb. 28, 1997 [JP] Japan .................................. 9-045840

[51] Int. Cl.⁷ .................................................. G11C 29/00
[52] U.S. Cl. ........................ 714/724; 365/233; 365/201
[58] Field of Search ................... 371/22.1, 22.2, 371/22.6; 395/555; 375/354; 365/233; 714/724, 725, 734

[56] References Cited

U.S. PATENT DOCUMENTS 4,504,784  3/1985  Goel et al. ................................ 324/73

5,548,621  8/1996  Brady et al. ............................. 375/354

FOREIGN PATENT DOCUMENTS 62-274276  11/1987  Japan .

*Primary Examiner*—Emmanuel L. Moise
*Assistant Examiner*—Esaw Abraham
*Attorney, Agent, or Firm*—Foley & Lardner

[57] ABSTRACT

A semiconductor integrated circuit device includes logic circuits for internally generating a desired pulse. Also, the device includes a plurality of logic stages for logical processes, the logic stages, in each logic stage, having constituent elements having sizes in common and having, between adjacent ones of the logic stages, parasitic capacitances and resistances in common. The semiconductor integrated circuit device can realize a minimum pulse width from a rising edge to a falling edge or from a falling edge to a rising edge of a pulse, which has been difficult to form in a testing device.

3 Claims, 4 Drawing Sheets

Fig. 3
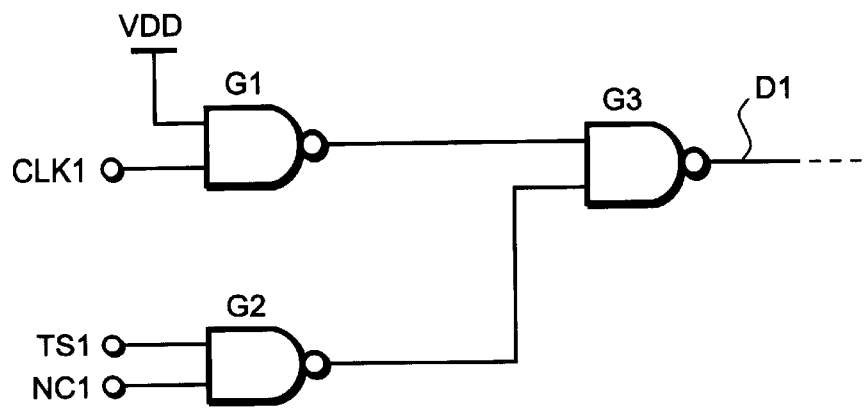
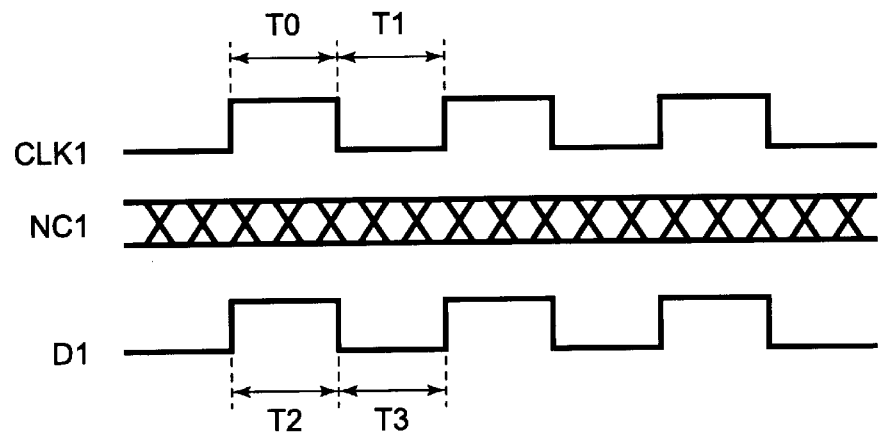
Fig. 4A
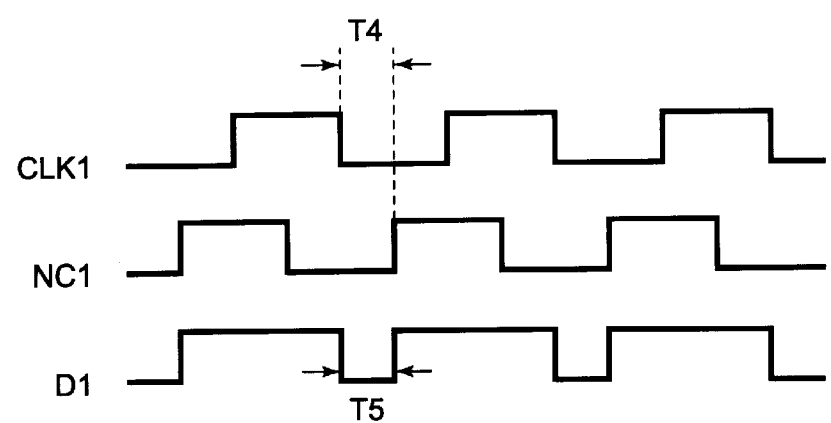
Fig. 4B

TESTING MECHANISM IN A SEMICONDUCTOR INTEGRATED CIRCUIT DEVICE USING AN EXTERNAL CLOCK SIGNAL AND A NON-CONNECTION PIN INPUT SIGNAL

BACKGROUND OF THE INVENTION (1) Field of the Invention

The present invention relates to a semiconductor integrated circuit having a test function, and more particularly, to a semiconductor integrated circuit which can realize a minimum pulse width from a rising edge to a falling edge or from a falling edge to a rising edge of a pulse, which has been difficult to form in a testing device.

(2) Description of the Related Art

The prior art semiconductor integrated circuit of the kind to which the present invention relates is first explained to assist the understanding of the present invention. FIG. 1 is a circuit diagram showing such a prior art semiconductor integrated circuit device, and FIG. 2 is a timing chart referred to for describing the operation of the circuit shown in FIG. 1.

The prior art semiconductor integrated circuit device of the kind referred to above is disclosed, for example, in Japanese Patent Application Kokai Publication No. Sho 62-274276, and is used for forming a test clock signal having highly accurate time difference and pulse width in a high frequency operation.

With respect to a product such as a synchronous SRAM (Static Random Access Memory), in order to confirm the capability of master and slave switching in an internal latch circuit, it is necessary to transmit clocks of a very high frequency with accuracy to the inside of the semiconductor integrated circuit. However, an outer terminal of the semiconductor integrated circuit or a signal line between the semiconductor integrated circuit and a testing device inevitably has parasitic capacitance and distributed resistance. Therefore, it is considered difficult to transmit a clock signal of a high frequency directly to the inside of the semiconductor integrated circuit. This is so because, even when it is attempted to supply a clock signal of a high frequency, the time constant circuit formed by the above parasitic capacitance and distributed resistance causes a signal delay or a waveform distortion of the clock signal, that cannot be ignored.

In the system shown in FIG. 1, which is disclosed in Japanese Patent Application Kokai Publication No. Sho 62-274276, a system clock signal SCK which is supplied from an external terminal is supplied through an AND gate G11 to clock terminals of flip-flops FF1, FF2, etc. constituting an internal logic circuit. A control signal C which is also supplied from an external terminal, is a switching control signal for controlling the switching between the above-mentioned system clock signal SCK and a later explained clock signal TCK which is generated by a test clock signal TCK generator, and is supplied to an AND gate G12. An inverted output C' is supplied as a control signal to another input terminal of the AND gate circuit G11. A non-inverted output of the AND gate G12 is supplied as a control signal to an AND gate G13, which transmits the test clock signal TCK provided from the test clock signal TCK generator which is explained later. The AND gates G11 and G13 have their output terminals connected to a wired OR gate YG1 whose output signal is provided to the clock terminals of the above-mentioned flip-flops FF1, FF2, etc. The internal logic circuit comprises the flip-flop FF1 illustrated as an example, a logic block LOG for receiving the output thereof and an output signal from another flip-flop (not shown), and the flip-flop FF2 which receives an output signal of the logic block LOG.

In order to permit accurate determination of the signal propagation delay time in the logic block LOG in the internal logic circuit, generator circuits for generating following test clock signals TCK1 and TCK2 are provided.

A first test signal TCA externally supplied from a first terminal is supplied to an input buffer G14 constituted by an AND gate, and is also supplied to a delay inverter circuit DL constituted by three NAND gates G15, G16 and G17 having an inverter construction. The AND gate G14 and the NAND gate G17 have their output terminals connected to a wired AND gate YG2. The wired AND connection provides a one-shot pulse substantially corresponding to the delay time of the delay circuit DL in synchronization with the rising of the signal TCA from a low level (i.e., logic "0") to a high level (i.e., logic "1").

A second test signal TCB which is externally supplied from a second terminal, is supplied to a similar one-shot pulse generator. Specifically, the second test signal TCB is supplied to an input buffer G18 constituted by an AND gate, and is also supplied to a delay inverter circuit DL constituted by three serially connected NAND gates G19, G20 and G21 having an inverter construction. The AND gate G18 and the NAND gate G21 have their output terminals connected to a wired AND gate YG4. This wired AND connection forms a one-shot pulse substantially corresponding to the delay time of the delay inverter circuit DL in synchronization with the rising of the signal TCB from a low level (or logic "0") to a high level (or logic "1").

The above two one-shot pulse generators have their output terminals connected to a wired OR gate YG3 whose output forms the test clock signal TCK described above.

The operation of the test clock generator in this circuit will now be described with reference to a timing chart shown in FIG. 2.

When the test signal TCA is changed in its level from the low level to the high level, the output signal of the delay inverter circuit DL is changed in its level from the high level to the low level after a delay time. The clock signal TCK1 from the wired AND gate YG2 is thus at the high level during the delay time T15 of the delay inverter circuit DL, during which the two signals are at the high level. Likewise, when the second test signal TCB is changed from the low level to the high level, the output signal of the delay inverter circuit DL is changed in its level from the high level to the low level after a delay time. The clock signal TCK2 from the wired AND gate YG4 is thus at the high level during the delay time T15 of the delay inverter circuit DL, during which the two signals are at the high level.

The time difference T16 between the clock signals TCK1 and TCK2 thus can be derived or calculated from the rise time difference T14 between the two test signals TCA and TCB externally supplied from the external terminals. Since the clock signals TCK1 and TCK2 are generated by the internal circuit, the time difference between the rising edges of both the clock signals is substantially equal to the above time difference T14, and the pulse width is set by the delay time T15. Since the clock signals TCK1 and TCK2 are formed by the internal circuit, their pulse widths T15 and falling edges are respectively substantially constant. Thus, for accurate testing of a high frequency clock signal, it is only necessary that the time difference T14 between the rising edges of the test signals TCA and TCB externally supplied through the external terminals is accurate.

In the above prior art semiconductor integrated circuit, since the path of the system clock and the path of the test clock are different, the external input and internal timing cannot be accurately controlled.

In addition, since the one-shot pulse generators are utilized, it is impossible to vary the pulse width from the rising to the falling of the clock (hereinafter referred to TKHKL) and the pulse width from the falling to the rising of the clock (hereinafter referred to as TKLKH).

Furthermore, in the case where both TKHKL and TKLKH are measured, there is a problem that the circuit scale is increased.

SUMMARY OF THE INVENTION

An object of the invention, therefore, is to overcome the problems existing in the prior art, and to provide a semiconductor integrated circuit which can realize the minimum pulse width from the rising to the falling or from the falling to the rising of a pulse, which has been difficult to form in a testing device.

According to one aspect of the invention, there is provided a semiconductor integrated circuit device having a test function, the device comprising:

means to process an external clock signal and a non-connection pin input signal; and means to generate a desired pulse internally of the device by logically processing the processed external clock signal and the processed non-connection pin input signal.

The semiconductor integrated circuit device may further include logic circuits for generating a plurality of kinds of pulses.

The semiconductor integrated circuit device may include a plurality of logic stages for logical processes, the logic stages, in each logic stage, having constituent elements having sizes in common and having, between adjacent ones of the logic stages, parasitic capacitances and resistances in common.

According to the invention, system clock and test signal thus can be logically processed, and the sizes and the stages of the logic gate of their paths are respectively the same, so that it is possible to provide the same delay time of an internal clock signal as in the normal operation.

With the above means, it is possible to generate at the inside a minimum pulse width from the rising to the falling and that from the falling to the rising of a pulse, which are determined by the timing difference between two input signals supplied from different terminals.

BRIEF DESCRIPTION OF THE DRAWINGS

The above and other objects, features and advantages of the present invention will be apparent from the following description of preferred embodiments of the invention explained with reference to the accompanying drawings, in which:

FIG. 3 is a circuit diagram showing a first embodiment of the semiconductor integrated circuit device according to the invention;

FIG. 4A is a timing chart referred to for describing the normal operation of the circuit shown in FIG. 3;

FIG. 4B is a timing chart referred to for describing the operation of the circuit shown in FIG. 3 when measuring TKLKH;

PREFERRED EMBODIMENTS OF THE INVENTION

Now, preferred embodiments of the invention will be described with reference to the drawings.

FIG. 3 shows in a circuit diagram an embodiment of the semiconductor integrated circuit device according to the invention. FIG. 4A is a timing chart for use in describing the operation of the circuit shown in FIG. 3 in normal operation. FIG. 4B is a timing chart for use in describing the operation of the circuit shown in FIG. 3 in a TKLKH measurement operation.

In this embodiment, NAND gates G1 and G2 are of the same size elements. A system clock signal CLK1 and a non-connection pin input signal NC1 externally supplied through external terminals, are logically processed by a NAND gate G3 through the respective NAND gates G1 and G2. The parasitic capacitance and the resistance between the NAND gates G1 and G3 and those between the NAND gates G2 and G3 are made to be consistent with each other. Another input terminal of the NAND gate G1 is connected to a maximum power supply potential VDD.

The normal operation and the TKLKH measurement operation of this embodiment of the invention will be described with reference to FIGS. 4A and 4B.

In the normal operation, test signal TS1 is fixed to "L" ("Low"), so that the output of the NAND gate G2 becomes "H" ("High") irrespective of a non-connection pin input signal NC1. In this case, TKHKL ("T2") and TKLKH ("T3") of the internal clock signal D1 are equal to TKHKL ("T0") and TKLKH ("T1") of the external clock signal CLK1, respectively.

When measuring the operation limit of TKLKH, the test signal TS1 is fixed to "H", and the output of the NAND gate G2 becomes an inversion signal of the non-connection pin input signal NC1. The output of the NAND gate G2 and that of the NAND gate G1 are logically processed by the NAND gate G3 so that the internal clock signal D1 is outputted.

Only during time T4, during which the external clock signal CLK1 and the non-connection pin input signal NC1 are both "L", the internal clock signal D1 is "L", and determines time T5 of TKLKH. As mentioned before, in this circuit the input stages have a common element size, and the parasitic capacitances and the resistances between adjacent stages are in common. Thus, for accurate testing of a high frequency clock signal, it is only necessary that the timings of the clock edges of the external clock signal CLK1 and the non-connection pin input signal NC1 supplied from the external terminals are accurate.

A second embodiment of the invention will now be explained.

Figure 1:
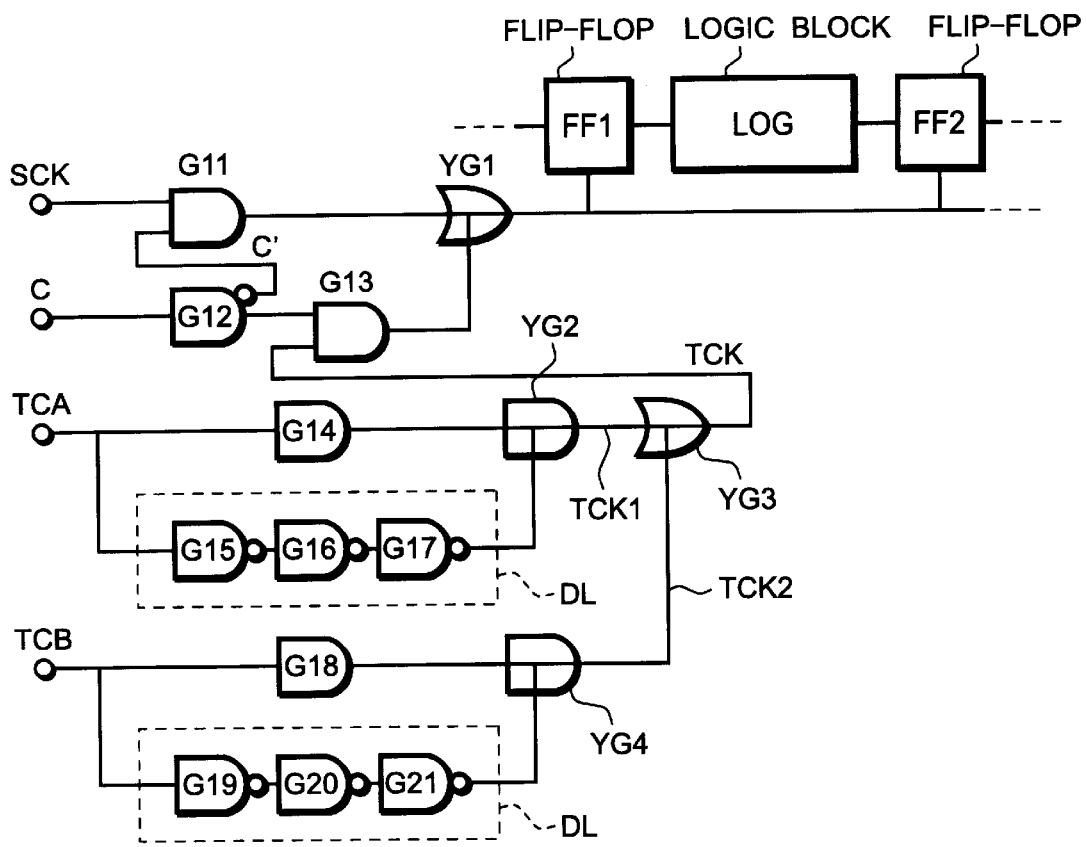
FIG. 1 is a circuit diagram showing a prior art semiconductor conductor integrated circuit device.
Figure 2:
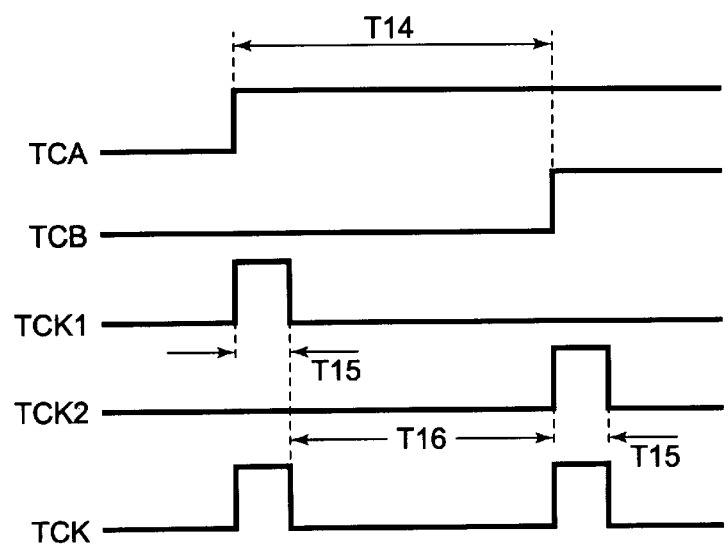
FIG. 2 is a timing chart referred to for describing the operation of the circuit shown in FIG. 1.
Figure 5:
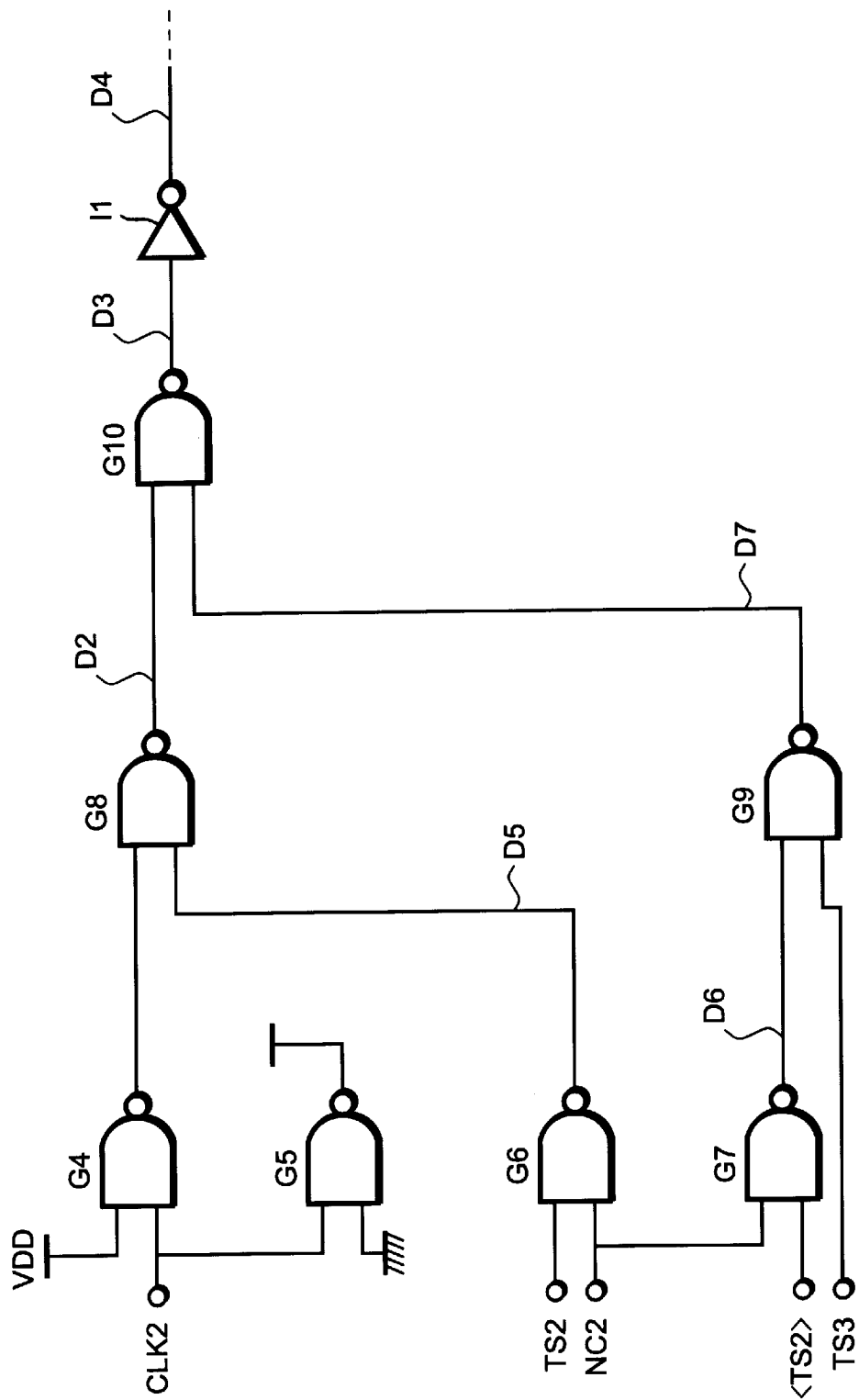
FIG. 5 is a circuit diagram showing a second embodiment of the invention.
Figure 6A:
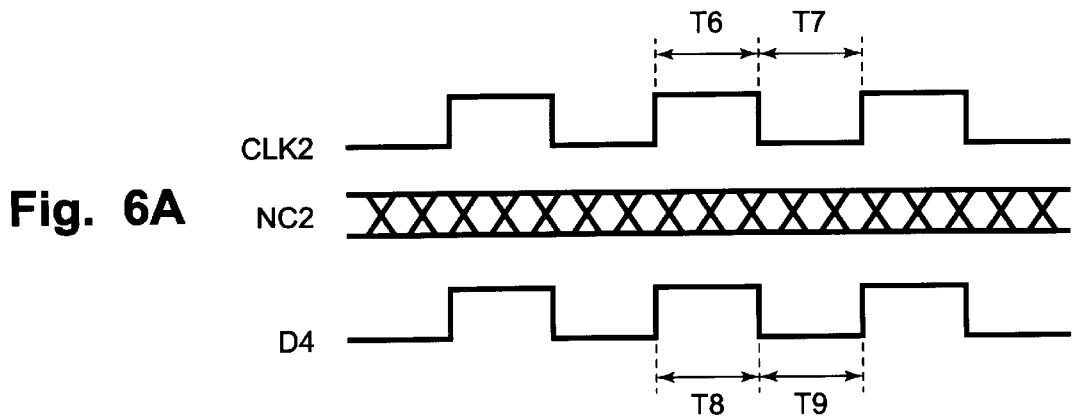
FIG. 6A is a timing chart referred to for describing he normal operation of the circuit shown in FIG. 5.
Figure 6B:
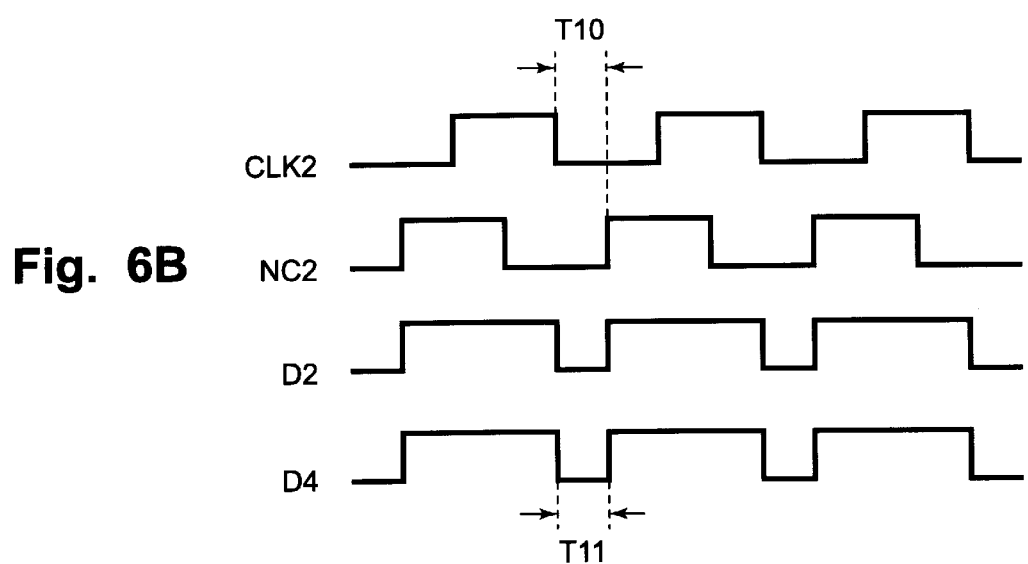
FIG. 6B is a timing chart referred to for describing he operation of the circuit shown in FIG. 5 when measuring TKLKH.
Figure 6C:
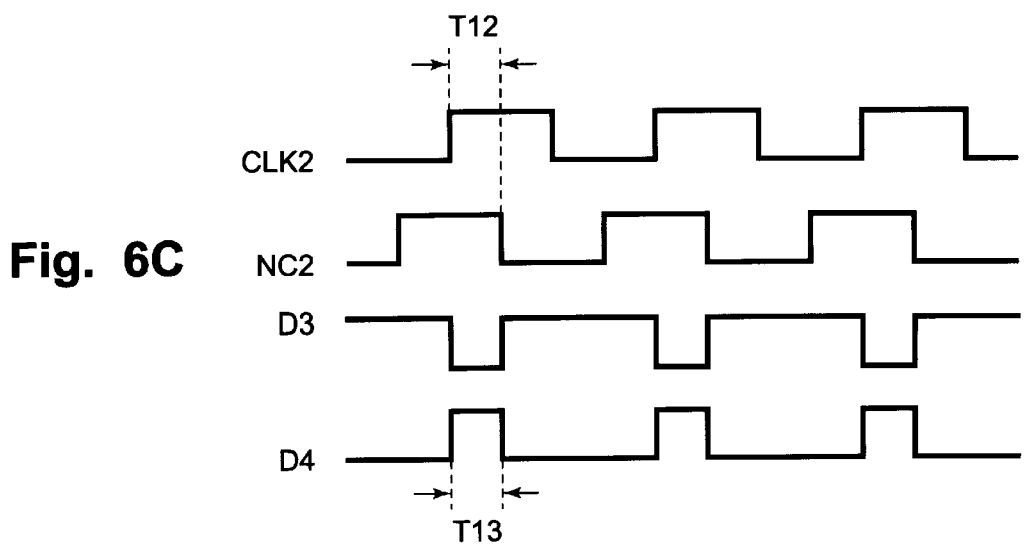
FIG. 6C is a timing chart referred to for describing the operation of the circuit shown in FIG. 5 when measuring TKHKL.

FIG. 5 is a circuit diagram showing a second embodiment of the circuit according to the invention. FIG. 6A is a timing chart referred to for describing the normal operation of the circuit. FIG. 6B is a timing chart referred to for describing a TKLKH measurement operation of the same circuit. FIG. 6C is a timing chart referred to for describing a TKHKL measurement operation of the same circuit.

The second embodiment is different from the previous first embodiment in that it permits TKHKL measurement in addition to the TKLKH measurement in the test mode.

An external clock signal CLK2 is inputted to a NAND gate G4 and a non-connection pin input signal NC2 is inputted to NAND gates G6 and G7. The outputs of the NAND gates G4 and G6 are logically processed by a NAND gate G8, or the outputs of the NAND gates G8 and G9 are logically processed by a NAND gate G10.

In the individual logic stages, the NAND gates G4 to G7 are constituted by elements having the same size, and the NAND gates G8 and C9 are constituted by elements having the same size. The logic stages from the external clock signal CLK2 and those from the non-connection pin input signal NC2 to the respective gates for taking the logical sum are of the same number. Furthermore, it is so arranged that parasitic capacitances and resistances be consistent between the NAND gates G4 and G8, between the NAND gates G6 and G8 and between the NAND gates G7 and G9 in one logic stage, and parasitic capacitances and resistances be consistent between the NAND gates G8 and G10 and between the NAND gates G9 and G10 in another logic stage.

The normal operation, and the TKLKH and TKHKL measurement operations in the test mode in this embodiment will now be described with reference to the circuit diagram shown in FIG. 5 and the timing charts shown in FIGS. 6A to 6C.

In the normal operation, test signals TS2 and TS3 are both fixed to "L", and an inversion signal <TS2> of TS2 is fixed to "H", so that outputs D5 and D7 of the NAND gates G6 and G9 become fixed to "H" regardless of the non-connection pin input signal NC2. In this case, the times T8 and T9 of measurement of TKHKL and TKLKH of the internal clock signal D4 are equal to the times T6 and T7 of measurement of TKHKL and TKLKH of the external clock signal CLK2, respectively.

When measuring the operation limit of TKLKH, the test signal TS2 is fixed to "H", and the test signal TS3 and the inversion signal <TS2> are both fixed to "L". In this case, the output D5 of the NAND gate G6 becomes an inversion signal of the non-connection pin input signal NC2 and, the outputs of the NAND gates G6 and G4 are logically processed at the NAND gate G8, so that the internal clock signal D3 is outputted through the NAND gate G10.

Also, only during the time T10, during which the external clock signal CLK2 and the non-connection pin input terminal NC2 are both "L", the internal clock signal D4 becomes "L", thus determining the time T11 of TKLKH.

When measuring the operation limit of TKHKL, the test signal TS2 is fixed to "L", and the test signal TS3 and the inversion signal <TS2> are both fixed to "H". In this case, the output D6 of the NAND gate G7 becomes an inversion signal of the non-connection pin input signal NC2 and, the output of the NAND gate G9 which receives the output D6 and that of the NAND gate G8 are logically processed at the NAND gate G10, so that the internal clock signal D3 is outputted from the NAND gate G10.

Only during the time T12, during which the external clock signal CLK2 and the non-connection pin input signal NC2 are both "H", the internal clock signal D4 becomes "H", and the time T13 of TKHKL is determined.

As has been described in the foregoing, it is possible to provide a semiconductor integrated circuit device, which has a structure of generating a desired pulse internally of the device by logically processing a usual external clock and an non-connection pin input signal, and may include a logic circuit for generating various kinds of pulses, thus realizing the minimum pulse width from the rising to the falling and that from the falling to the rising of a pulse.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A testing mechanism in a semiconductor integrated circuit device, said mechanism comprising:

means to process an external clock signal and a non-connection pin input signal;

means to generate a desired pulse internally of the device by logically processing the processed external clock signal and the processed non-connection pin input signal, and a plurality of logic stages for logical processes, said logic stages, in each logic stage, having constituent elements having sizes in common and having, between adjacent ones of said logic stages, parasitic capacitances and resistances in common.

2. A testing mechanism in a semiconductor integrated circuit device, said mechanism comprising:

a first NAND gate;

a second NAND gate constituting a first logic stage together with said first NAND gate; and a third NAND gate receiving outputs of said first and second NAND gates and constituting a second logic stage, said first and second NAND gates having sizes in common, and said first and second logic stages having, between them, parasitic capacitances and resistances in common.

3. A testing mechanism in a semiconductor integrated circuit device, said mechanism comprising:

a first stage of logic circuitry for processing an external clock signal and for processing a non-connection pin input signal, a second state of logic circuitry, electrically connected to said first stage for generating a test signal having desired pulse widths to test operation of said semiconductor integrated circuit device, and wherein said first stage of logic circuitry further comprises a first subset of logic circuitry for processing said external clock signal and a second subset of logic circuitry for processing said non-connection pin input signal, and wherein circuitry in said first and second stages is arranged such that parasitic capacitance and resistance between said first subset and said second stage is substantially the same as between said second subset and said second stage.

* * * * *